United States Patent [19]

Khanna

[11] Patent Number: 4,733,199

[45] Date of Patent: Mar. 22, 1988

[54] MULTI-FREQUENCY DIELECTRIC RESONATOR OSCILLATOR USING PARALLEL FEEDBACK

[75] Inventor: Amarpal S. Khanna, San Jose, Calif.

[73] Assignee: Avantek, Inc., Santa Clara, Calif.

[21] Appl. No.: 12,740

[22] Filed: Feb. 9, 1987

Related U.S. Application Data

[63] Continuation-in-part of Ser. No. 809,161, Dec. 16, 1985, Pat. No. 4,649,354.

[51] Int. Cl.[4] .............................................. H03B 5/18
[52] U.S. Cl. ..................................... 331/99; 331/179
[58] Field of Search ............. 331/96, 117 R, 117 FE, 331/117 D, 179, 99, 107 SL; 334/42, 47

[56] References Cited

U.S. PATENT DOCUMENTS 3,969,681  7/1976  Fincke ..................................... 330/56
4,078,210  3/1978  Lewis .............................. 331/107 A
4,442,415  4/1984  Ashida ............................... 332/16 T
4,484,156  11/1984  Khanna et al. ........................ 331/60
4,567,449  1/1986  Bert et al. ............................. 331/56

Primary Examiner—Siegfried H. Grimm
Attorney, Agent, or Firm—Limbach, Limbach & Sutton

[57] ABSTRACT

A switchable, parallel-feedback, multi-frequency dielectric resonator oscillator that generates microwave energy at any of several available frequencies is disclosed. The oscillator includes an amplifier that is operable for oscillation at a frequency determined by a parallel feedback dielectric resonator connected between its output and input terminals, and a switching circuit for selectively connecting any one of a plurality of dielectric resonators to the input terminal of the amplifier. The oscillation frequency of the oscillator is determined by a resonant frequency of whichever of the dielectric resonators is connected to the input terminal of the amplifier through the switching circuit.

8 Claims, 4 Drawing Figures

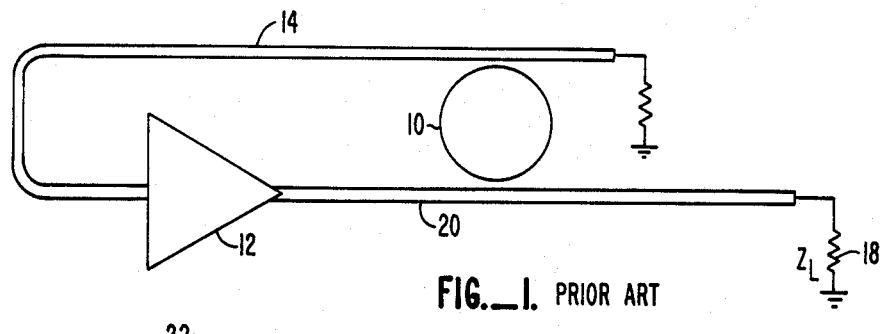
FIG._1. PRIOR ART
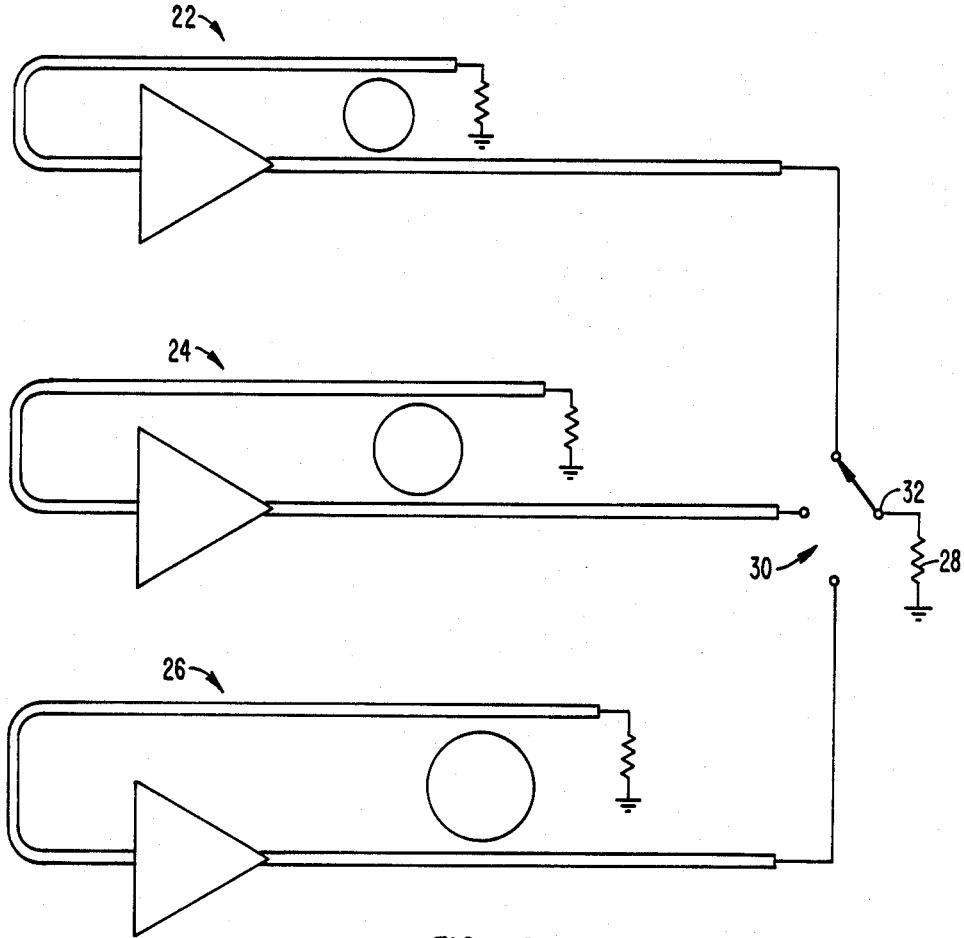
FIG._2. PRIOR ART

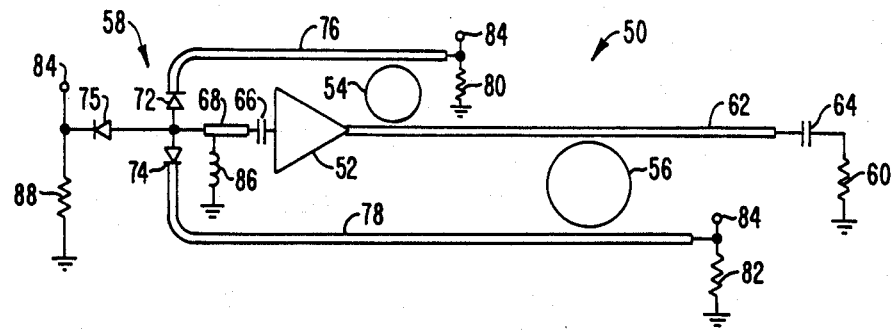
FIG._3.
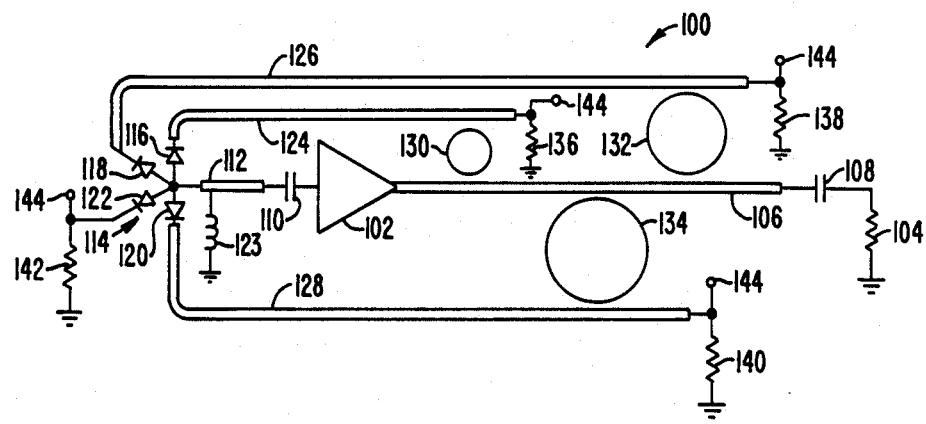
FIG._4.

MULTI-FREQUENCY DIELECTRIC RESONATOR OSCILLATOR USING PARALLEL FEEDBACK

RELATED PATENT APPLICATION

This is a continuation-in-part of co-pending patent application Ser. No. 809,161 filed Dec. 16, 1985 and now U.S. Pat. No. 4,649,354.

BACKGROUND OF THE INVENTION

1. Field of the Invention

This invention relates generally to microwave frequency dielectric resonator oscillators, and relates more particularly to a parallel-feedback, dielectric resonator oscillator that generates microwave energy at a selected one of several fixed frequencies.

2. Description of the Relevant Art

Microwave frequency oscillators are key elements of many communication systems and radars. A fixed frequency microwave oscillator is often implemented in a hybrid circuit using an amplifier and a parallel feedback path comprised of a dielectric resonator and associated microstrip lines. One parallel-feedback, dielectric resonator oscillator, known in the prior art, is shown in FIG. 1. Other, series-feedback, dielectric resonator oscillators are shown in co-pending patent application Ser. No. 809,161, which is hereby incorporated by reference.

The prior art oscillator of FIG. 1 includes a dielectric resonator 10 as a parallel feedback element coupled between the input and output terminals of an amplifier 12 via a feedback microstrip line 14. The output terminal of the amplifier is coupled to the load 18 via an output microstrip line 20. The dielectric resonator 10 is disposed between the output and feedback microstrip lines 20 and 14, and acts to couple some of the output energy of the amplifier, at a resonant frequency of the dielectric resonator, back into the input terminal of the amplifier. The amplifier typically contains a field-effect or bipolar transistor plus the appropriate biasing circuitry. In operation, the amplifier 12 oscillates at a frequency equal to a resonant frequency of the dielectric resonator 10.

While such single frequency oscillators are useful, there is also a need for microwave oscillators that can selectively generate any of several discrete frequencies. The design requirements of such an oscillator include (1) output frequency selection from several available frequencies, (2) stable output frequencies, (3) fast switching between frequencies, and (4) no spurious signals.

One approach to providing a multiple-frequency oscillator is to join together several dielectric resonator oscillators, as shown in FIG. 2. Any one of three separate dielectric resonator oscillators 22, 24, and 26, each with a different operational frequency, are selectively connected to a load 28 via a switch 30. The switch 30, which is shown schematically as a single-pole, triple-throw switch, may be implemented using PIN type diodes.

In some implementations of such a multiple frequency device, all of the dielectric resonator oscillators would continuously operate in order to provide stable operation and to allow fast switching from one frequency to another. In theory, only the signal generated by the selected dielectric resonator oscillator is supplied to the output terminal 32. In actuality, however, signals from the non-selected dielectric resonator oscillators leak through the switch to create unwanted spurious signals in the output signal. Extremely high isolation switches are required to reduce such signal leakage. The isolation values required are generally difficult to meet as a practical matter even with complex and expensive multi-throw switches, particularly within the X and Ku frequency bands. The presence of spurious signals can be a very severe problem in certain electronic warfare systems, wherein a spurious signal may be erroneously interpreted as a threat signal.

In other implementations of prior art multiple frequency oscillators, the dielectric resonator oscillators are switched on only when needed to generate the output signal. While this approach eliminates the spurious signal problem, it greatly increases the switching time because one oscillator must be switched on and another oscillator must be switched off each time the output frequency is changed. In addition, frequency of the output signal may wander somewhat before the selected oscillator stabilizes. Such implementations, therefore, suffer from the drawbacks of increased switching time and decreased stability.

SUMMARY OF THE INVENTION

In accordance with the illustrated preferred embodiment, the present invention provides a switchable, multi-frequency, parallel-feedback, dielectric-resonator oscillator that generates microwave energy at any of several discrete frequencies. The oscillator of the present invention includes an amplifier that is operable for oscillation at a frequency determined by a parallel-feedback dielectric resonator connected between the input and output terminals of the amplifier, includes switching means for selectively connecting any one of a plurality of parallel-feedback dielectric resonators to the input terminal of the amplifier, and includes the dielectric resonators and associated microstrip lines. The oscillation frequency of the oscillator is determined by a resonant frequency of whichever of the parallel-feedback dielectric resonators is connected to the input terminal of the amplifier through the switching means. The dielectric resonators are disposed between an output microstrip line that is coupled to the output terminal of the amplifier and an associated feedback microstrip line that is coupled to the switching means. When switched into connection with the input terminal of the amplifier, a selected dielectric resonator provides a parallel feedback signal to the amplifier, the frequency of which determines the oscillation frequency of the oscillator.

The switchable, multi-frequency, parallel-feedback, dielectric-resonator oscillator of the present invention offers several advantages over prior art multiple frequency oscillators. First, there are no spurious, unselected frequencies in the output signal because the non-selected dielectric resonators are passive components that do not themselves oscillate. Only when a dielectric resonator is selectively coupled to the amplifier through the switch is a signal generated. Second, only a single amplifier is required, which means that the multiple frequency oscillator of the present invention can be constructed in a smaller size and at a lower cost and, while operating, will consume less power. Third, the size of the oscillator is small also because the dielectric resonators are clustered around the output microstrip lines. Fourth, the settling time and switching speed between frequencies is fast because only passive components are switched and because the amplifier is always on.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is a schematic diagram of a prior art parallel-feedback type of a dielectric resonator oscillator.

FIG. 2 is a schematic diagram of a prior art multiple frequency oscillator utilizing three parallel-feedback dielectric resonator oscillators.

FIG. 3 is a schematic diagram of a switchable, parallel-feedback, multi-frequency oscillator according to the present invention.

FIG. 4 is a schematic diagram of an alternative embodiment of the oscillator of the present invention.

DETAILED DESCRIPTION OF THE PREFERRED EMBODIMENT

FIGS. 3 and 4 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a parallel-feedback, multiple-frequency dielectric resonator oscillator 50, as shown in FIG. 3, that generates microwave energy at either of two available frequencies. The oscillator 50 includes an amplifier 52, two dielectric resonators 54 and 56, and a diode switch 58 that selectively couples one of the two dielectric resonators to the input terminal of the amplifier as a parallel feedback element. The amplifier 52 is operable for oscillation at a frequency determined by a resonant frequency of whichever of the dielectric resonators is connected to the input terminal of the amplifier through the diode switch 58.

More specifically, the amplifier 52 includes a field-effect or bipolar transistor plus associated matching circuitry that biases the transistor for oscillation within the desired frequency range. The amplifier may be composed of discrete components, or may be a monolithic microwave integrated circuit (MMIC), such as a model MGA-20600 Gallium Arsenide MMIC amplifier, available from Avantek, Inc. of Santa Clara, California.

The amplifier 52 has its output terminal coupled to a load 60 through an output microstrip line 62 and capacitor 64. The input terminal of the amplifier 52 is connected through a capacitor 66 and a short microstrip line 68 to the common anode terminal of the diode switch 58, which includes three diodes 72, 74, and 75. The cathodes of diodes 72 and 74 are respectively connected to feedback microstrip lines 76 and 78, which extend past the adjacently positioned dielectric resonators 54 and 56, respectively. The opposite ends of the feedback microstrip lines 76 and 78 are terminated to ground through resistors 80 and 82, respectively. Biasing terminals 84 are provided at a convenient location on the cathode side of each diode for the application of bias voltages to operate the diode switch 58. Each dielectric resonator is located between the output microstrip line 62 and its corresponding feedback microstrip line. An inductor 86 is coupled between the short microstrip line 68 and ground. The cathode of diode 75 is terminated to ground through a grounding resistor 88.

The oscillator 50 is preferably implemented as a hybrid circuit with connections between the amplifier and the dielectric resonators being accomplished with microstrip lines, which are conductive traces on the surface of a non-conductive substrate, such as a ceramic. The feedback microstrip lines 76 and 78 are preferably oriented in parallel with the output microstrip line 62 at spacings determined by the diameters of the dielectric resonators 54 and 56. The dielectric resonators 54 and 56 are preferably shaped like disks or rings with one base affixed to the substrate or placed on a convenient spacer. The sizes of the dielectric resonators are chosen for their effective resonant frequencies, according to design information available in the prior art. The actual positioning of the dielectric resonators with respect to their corresponding microstrip lines determines the degree of coupling between the dielectric resonators and the microstrip lines as is known from prior art descriptions of dielectric resonator oscillators. Each dielectric resonator is positioned at a distance from the amplifier 52 such that the oscillation condition for that dielectric resonator is met, namely, that the net phase shift of the feedback loop is equal to zero. The dielectric resonators may be placed on opposite sides of the output microstrip line 62, as shown, or may be placed on the same side of the output microstrip line, provided that the dielectric resonators are positioned far enough apart to eliminate crosstalk.

The diodes of the diode switch 58 are preferably PIN or NIP diodes, which have an intrinsic layer sandwiched between the positive and negative doped layers, and which are known to work well for switching at microwave frequencies. PIN diode switches may be obtained, for example, from Scientific Devices, Inc. of N. Billerica, Massachusetts.

In operation as an oscillator, one of the diodes 72 or 74 is forward biased and the other two diodes are reverse biased by application of appropriate voltages at the biasing terminals 84. Such biasing electrically connects one of the two feedback microstrip lines 76 or 78 to the input terminal of the amplifier 52, while isolating the other feedback microstrip line and the grounding resistor 88. For example, if diodes 74 and 75 are reverse biased and diode 72 is forward biased, then the feedback microstrip line 76 and its associated dielectric resonator 54 are thereby coupled to the input terminal of the amplifier 52. A portion of the output energy from the amplifier 52 will be coupled as a parallel feedback signal through the dielectric resonator 54, feedback microstrip line 76, and diode 72 to the input terminal of the amplifier. The amplifier 52 will now oscillate at a frequency determined by a resonant frequency of the dielectric resonator 54. If, according to the example, the dielectric resonator 54 has a resonant frequency of 10.0 GHz and the amplifier has sufficient gain at 10.0 GHz, then the amplifier will oscillate at 10.0 GHz. The resultant output signal of the oscillator 50 is provided to other circuitry through the output microstrip line 66.

In order to switch to a different frequency, the diode switch 58 switches a different microstrip line and associated dielectric resonator into connection with the input terminal of the amplifier 52, thereby providing a parallel feedback signal at a different frequency. To switch out the previously connected microstrip line and dielectric resonator, the connecting diode is simply reverse biased by applying an appropriate voltage at the biasing terminal 84 for that branch. To switch in another microstrip line and dielectric resonator, the connecting diode is forward biased by applying an appropriate voltage at the biasing terminal 84 for that branch. Since a different dielectric resonator is now passively coupled to the oscillator circuit, the oscillator changes its oscillation frequency to match that of the newly coupled dielectric resonator.

Thus, the dielectric resonator oscillator 50 has two available frequencies from which its operational frequency can be selected. Since only one dielectric resonator is coupled to the oscillator circuit at any one time, no spurious signals are generated. Also, since the amplifier is continually on, the switching speed and settling time of the oscillator 50 is excellent.

If for some reason it is desirable to stop the oscillation of the amplifier 52, then the grounding resistor 88 is switched into connection with the input terminal of the amplifier by forward biasing diode 75 and reverse biasing the other diodes 72 and 74. This decouples the amplifier from the dielectric resonators 54 and 56 and stops the oscillation of the amplifier.

An alternative embodiment of the present invention, shown in FIG. 4, is a dielectric resonator oscillator 100 that generates microwave energy at any one of three available frequencies. The oscillator 100 is similar to the oscillator 50 shown in FIG. 3 with the addition of a third dielectric resonator and an associated microstrip line.

The amplifier 102 of oscillator 100 has its output terminal coupled to a load 104 through an output microstrip line 106 and a capacitor 108. The input terminal of the amplifier 102 is connected through a capacitor 110 and a short microstrip line 112 to the common anode terminal of a diode switch 114, which includes four diodes 116, 118, 120, and 122. The cathodes of diodes 116, 118, and 120 are respectively connected to microstrip lines 124, 126, and 128, which extend past corresponding dielectric resonators 130, 132, and 134, respectively. The opposite ends of microstrip lines 124, 126, and 128 are terminated to ground through resistors 136, 138, and 140, respectively. The cathode of diode 122 is terminated to ground through a grounding resistor 142. The short microstrip line 112 is coupled to ground through an inductor 123. Biasing terminals 144 are provided at the cathode side of each diode for the application of bias voltages to operate the diode switch 114.

In operation as an oscillator, one of the diodes 116, 118, or 120 is forward biased and the other three diodes are reverse biased by application of appropriate voltages at the biasing terminals 144. Such biasing electrically connects one of the three microstrip lines 124, 126, or 128 to the input terminal of the amplifier 102, while isolating the other two microstrip lines and the grounding resistor 142. The amplifier 102 will now oscillate at a frequency determined by a resonant frequency of the dielectric resonator that is coupled to the input terminal of the amplifier through the diode switch 114.

Thus, the oscillator 100 has three available frequencies from which its operational frequency can be selected, one for each dielectric resonator. If for some reason it is desirable to stop the oscillation of the amplifier 102, then the grounding resistor 142 is switched into connection with the input terminal of the amplifier by forward biasing diode 122 and reverse biasing the other diodes 116, 118, and 120. This decouples the amplifier from the dielectric resonators 130, 132, and 134, and stops the oscillation of the amplifier.

From the above description, it will be apparent that the invention disclosed herein provides a novel and advantageous apparatus for a switchable, parallel-feedback, multi-frequency dielectric resonator oscillator that generates microwave energy at any of several available frequencies. The foregoing discussion discloses and describes merely exemplary methods and embodiments of the present invention. As will be understood by those familiar with the art, the invention may be embodied in other specific forms without departing from the spirit or essential characteristics thereof. For example, additional frequencies of oscillation could be provided by the addition of more feedback paths, each consisting of a dielectric resonator, an associated microstrip line, and a switch diode. Accordingly, the disclosure of the present invention is intended to be illustrative, but not limiting, of the scope of the invention, which is set forth in the following claims.

What is claimed is:

1. A switchable dielectric resonator oscillator for generating microwave energy at a selected one of a plurality of available frequencies in the microwave range, said oscillator comprising:

an amplifier operable for oscillation within a frequency band in the microwave range and at a particular frequency as determined by a parallel feedback signal supplied to an input terminal of said amplifier;

switching means for selectively connecting any one of a plurality of dielectric resonators and associated feedback microstrip lines to the input terminal of said amplifier, wherein said switching means includes a plurality of diodes each connected in series between a feedback microstrip line and the input terminal of said amplifier, and includes diode biasing means for individually biasing said diodes; and a plurality of dielectric resonators and associated feedback microstrip lines operable for supplying a parallel feedback signal through said switching means to the input terminal of said amplifier, wherein each of said dielectric resonators is disposed between a feedback microstrip line that is coupled to said switching means and an output microstrip line that is coupled to the output terminal of said amplifier, wherein the oscillation frequency of said amplifier is determined by a resonant frequency of whichever of said dielectric resonators is connected through said switching means to the input terminal of said amplifier.

2. An oscillator as recited in claim 1 wherein said switching means includes means for selectively connecting a dielectric resonator between the input and output terminals of said amplifier by forward biasing the diode that connects said dielectric resonator to said amplifier and by reverse biasing the remaining diodes.

3. An oscillator as recited in claim 2 wherein said switching means further includes a grounding diode that is connected in series between the input terminal of said amplifier and a resistor coupled to ground, wherein said grounding diode is switched into connection with the input terminal of said amplifier to stop the oscillation of said amplifier.

4. An oscillator as recited in claim 1 wherein each of said dielectric resonators includes a mass of ceramic material affixed to a substrate at a position between its associated feedback microstrip line and said output microstrip line.

5. An oscillator as recited in claim 1 wherein said feedback microstrip lines extend along a substrate in a direction that is substantially parallel to said output microstrip line.

6. An oscillator as recited in claim 1 wherein said amplifier comprises a monolithic microwave integrated circuit.

7. A switchable dielectric resonator oscillator for generating microwave energy at a selected one of a plurality of available frequencies, said oscillator comprising:

an amplifier having gain in a frequency band within the microwave range and operable for oscillation at a particular frequency within said frequency band as determined by a parallel feedback signal supplied to an input terminal of said amplifier;

an output microstrip line connected to an output terminal of said amplifier;

a plurality of diodes connected in parallel to the input terminal of said amplifier;

a plurality of feedback microstrip lines each connected at one end thereof to one of said diodes and extending at the other end thereof in a direction substantially parallel to said output microstrip line;

a plurality of dielectric resonators each disposed between an associated feedback microstrip line and said output microstrip line and operable for supplying said parallel feedback signal to said amplifier; and diode biasing means for individually biasing said diodes, said diode biasing means being operable for selectively connecting a dielectric resonator and associated microstrip line to the input terminal of said amplifier by forward biasing the diode that connects said associated microstrip line to the input terminal of said amplifier and by reverse biasing the remaining diodes;

whereby the oscillation frequency of said amplifier is substantially equal to a resonant frequency of whichever of said dielectric resonators is connected to the input terminal of said amplifier.

8. A switchable dielectric resonator oscillator for generating microwave energy at a selected one of a plurality of available frequencies in the microwave range, said oscillator comprising:

an amplifier having gain in a frequency band within the microwave range and operable for oscillating at a particular frequency within said frequency band as determined by a resonant frequency of a dielectric resonator coupled as a parallel feedback element between output and input terminals of said amplifier;

a signal output microstrip line coupled to the output terminal of said amplifier;

a plurality of diodes each coupled in parallel to the input terminal of said amplifier;

a plurality of feedback microstrip lines each coupled at one end thereof to one of said diodes and extending at the other end thereof in a direction substantially parallel to said signal output microstrip line;

a plurality of dielectric resonators each disposed between an associated feedback microstrip line and said signal output microstrip line;

a resistor selectively coupled at one end thereof through one of said diodes to the input terminal of said amplifier and coupled at the other end thereof to ground; and diode biasing means for individually biasing said diodes to selectively connect a feedback microstrip line or said resistor to the input terminal of said amplifier by forward biasing the diode that connects said feedback microstrip line or said resistor to said amplifier and by reverse biasing the remaining diodes, wherein said amplifier oscillates at a resonant frequency of whichever of said dielectric resonators is coupled to the input terminal of said amplifier through a connected feedback microstrip line, and wherein said amplifier stops oscillating when said resistor is switched into connection with the input terminal of said amplifier.

* * * * *